(12) United States Patent
Jun

(10) Patent No.: US 10,872,943 B2
(45) Date of Patent: Dec. 22, 2020

(54) DISPLAY DEVICE

(71) Applicant: LG Display Co., Ltd., Seoul (KR)

(72) Inventor: Changhwa Jun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/522,025

(22) Filed: Jul. 25, 2019

(65) Prior Publication Data
US 2020/0044002 A1    Feb. 6, 2020

(30) Foreign Application Priority Data

Jul. 31, 2018   (KR) .................. 10-2018-0088955

(51) Int. Cl.
*H01L 27/32*   (2006.01)
*H01L 51/52*   (2006.01)
*H01L 27/12*   (2006.01)

(52) U.S. Cl.
CPC ...... *H01L 27/3258* (2013.01); *H01L 27/3246* (2013.01); *H01L 27/3262* (2013.01); *H01L 51/5218* (2013.01); *H01L 51/5271* (2013.01); *H01L 27/1248* (2013.01); *H01L 2251/5315* (2013.01)

(58) Field of Classification Search
None
See application file for complete search history.

(56) References Cited

U.S. PATENT DOCUMENTS

| 2005/0282308 A1 | 12/2005 | Uhlig et al. | |
| 2016/0149154 A1* | 5/2016 | Park | H01L 51/5209 257/40 |
| 2017/0243932 A1* | 8/2017 | Ohara | H01L 51/5012 |
| 2019/0312220 A1* | 10/2019 | Tsukamoto | H01L 51/001 |

FOREIGN PATENT DOCUMENTS

| KR | 10-2005-0121631 A | 12/2005 |
| KR | 10-2018-0002471 A | 1/2018 |

* cited by examiner

*Primary Examiner* — Steven M Christopher
(74) *Attorney, Agent, or Firm* — Morgan, Lewis & Bockius LLP

(57) ABSTRACT

A display device includes a substrate provided with a plurality of subpixel areas, a circuit element layer provided on the substrate and provided with a transistor for each subpixel area, an insulating layer provided on the circuit element layer and provided with a recessed portion formed to overlap the transistor, a reflective electrode provided on the insulating layer and provided in the recessed portion, a first electrode provided on the reflective electrode while being overlapped with the recessed portion, an organic light emitting layer provided on the first electrode, a bank provided between the subpixel areas while covering an end of the first electrode, and a second electrode provided on the organic light emitting layer, wherein the recessed portion, the reflective electrode and the first electrode may be provided with N stages, wherein N is an integer greater than 1, whereby light efficiency may be improved.

20 Claims, 8 Drawing Sheets

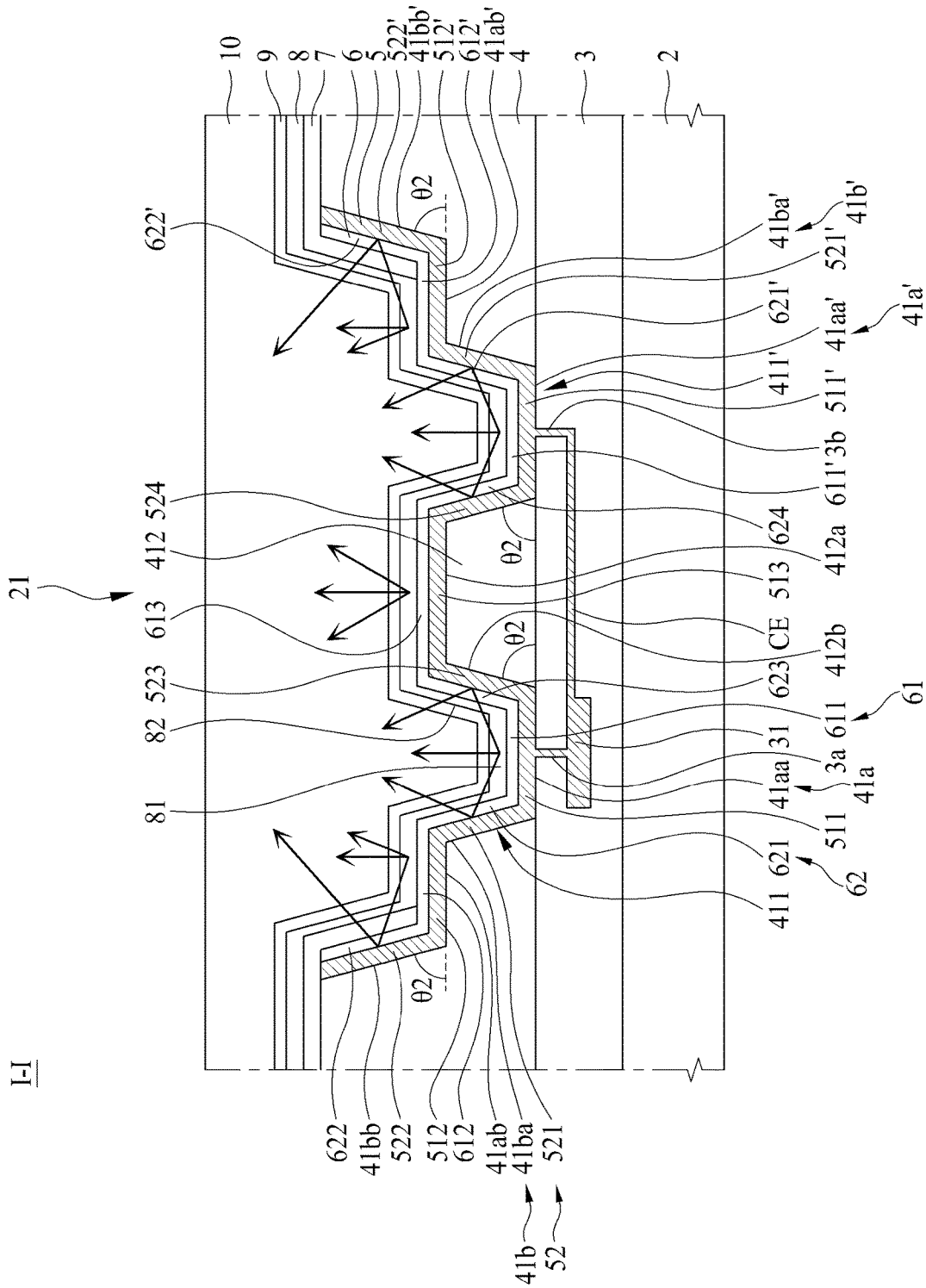

DISPLAY DEVICE

BACKGROUND

Technical Field

The present disclosure relates to a display device displaying an image.

Description of the Related Art

With the advancement of the information age, the demand for a display device for displaying an image has increased with various forms. Therefore, various types of display devices such as a liquid crystal display (LCD) device, a plasma display panel (PDP) display device, and an organic light emitting display (OLED) device have been used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

Recently, a head mounted display (HMD) including such an organic light emitting display device has been developed. The head mounted display is a glasses type monitor device of virtual reality (VR), which forms a focal point on a close distance in front of eyes of a user who wears the HMD in glasses or helmet type.

On the other hand, the organic light emitting display device has a problem in improving light efficiency because light is emitted from a light emitting area of which size is restrictive. Such a problem occurs more seriously in case of a head mounted display including an organic light emitting display device. Therefore, studies for a head mounted display with ultra-high resolution that can improve light efficiency have been actively ongoing.

SUMMARY

Accordingly, embodiments of the present disclosure are directed to a display device that substantially obviates one or more of the problems due to limitations and disadvantages of the related art.

An aspect of the present disclosure is to provide a display device that can improve light efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate provided with a plurality of subpixel areas, a circuit element layer provided on the substrate and provided with a transistor for each subpixel area, an insulating layer provided on the circuit element layer and provided with a recessed portion formed to overlap the transistor, a reflective electrode provided on the insulating layer and provided in the recessed portion, a first electrode provided on the reflective electrode while being overlapped with the recessed portion, an organic light emitting layer provided on the first electrode, a bank provided between the subpixel areas while covering an end of the first electrode, and a second electrode provided on the organic light emitting layer, wherein the recessed portion, the reflective electrode and the first electrode may be provided with N stages, wherein N is an integer greater than 1.

In the display device according to the present disclosure, as a contact hole for connecting the first electrode with the transistor may be provided with multiple stages and used as a light emitting area to improve light efficiency.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 4 is a brief cross-sectional view illustrating a display device according to the third embodiment of the present disclosure.

DETAILED DESCRIPTION

Figure 1:
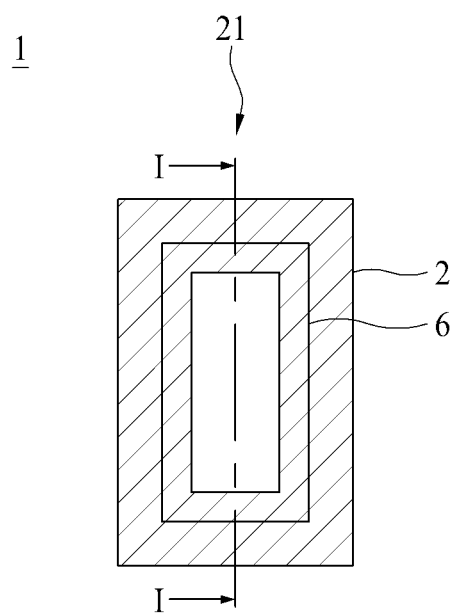
FIG. 1 is a brief plane view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the display device according to the present disclosure will be described in detail with reference to the accompanying drawings. Wherever possible, the same reference numbers will be used throughout the drawings to refer to the same or like parts.

Figure 2A:
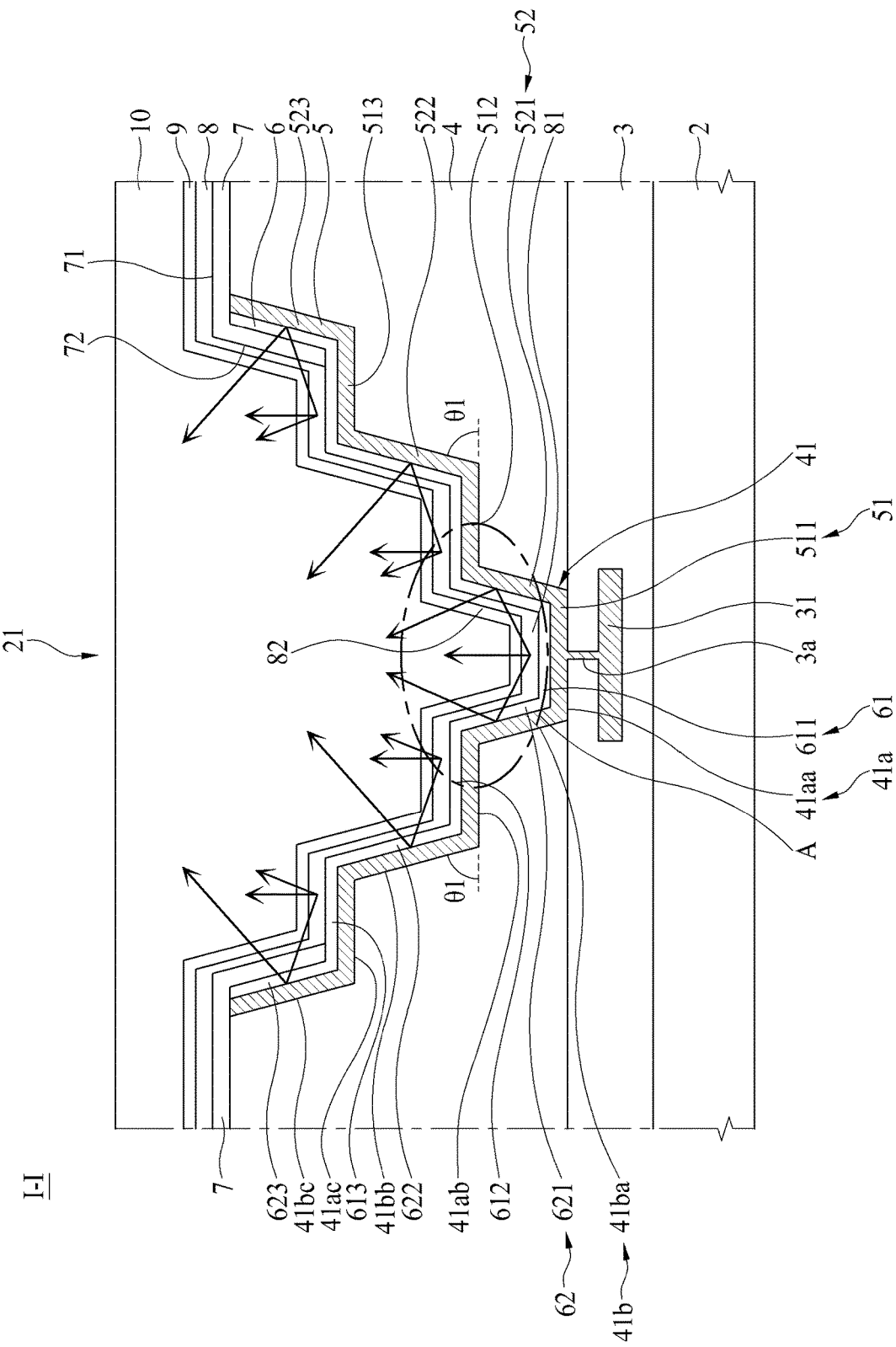
FIG. 2A is a brief cross-sectional view taken along line I-I shown in FIG. 1.
Figure 2B:
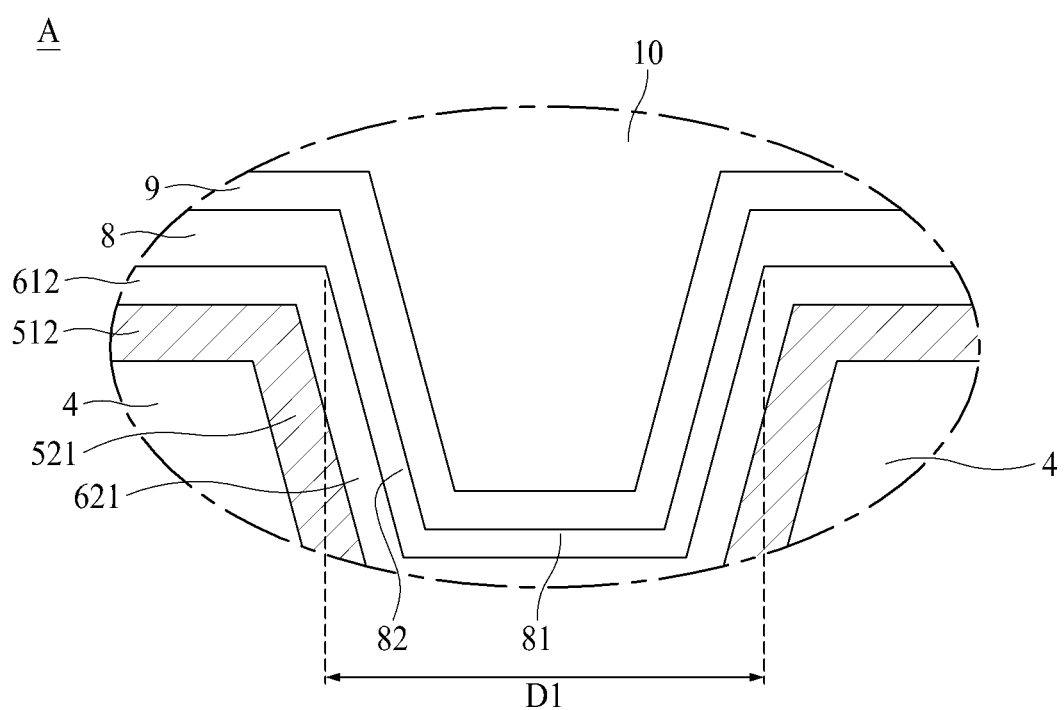
FIG. 2B is a brief enlarged view illustrating a part A shown in FIG. 2A.

FIG. 1 is a brief plane view illustrating a display device according to one embodiment of the present disclosure, FIG. 2A is a brief cross-sectional view taken along line I-I shown in FIG. 1, and FIG. 2B is a brief enlarged view illustrating a part A shown in FIG. 2A.

With reference to FIGS. 1 to 2B, the display device 1 according to one embodiment of the present disclosure comprises a substrate 2, a circuit element layer 3, an insulating layer 4, a reflective electrode 5, a first electrode 6, a bank 7, an organic light emitting layer 8, a second electrode 9, and an encapsulation layer 10.

The insulating layer 4 may include a recessed portion 41, and the recessed portion 41, the reflective electrode 5 and the first electrode 6 may be provided with N stages (N is an integer greater than 1). The reason why the recessed portion 41, the reflective electrode 5 and the first electrode 6 are provided with N stages, that is, multiple stages will be described with description of a light path at each stage after a structure of the display device 1 according to one embodiment of the present disclosure is described.

The substrate 2 may be a semiconductor substrate such as a plastic film, a glass substrate, or silicon.

The substrate 2 may include a plurality of subpixel areas. In the present disclosure, one of the plurality of subpixel areas, for example, a first subpixel area 21 will be described as an example. The plurality of subpixel areas including the first subpixel area 21 may be arranged to be adjacent to one another.

The first subpixel area 21 may emit light of various colors including white. The first subpixel area 21 may include an organic light emitting diode that includes a reflective electrode 5, a first electrode 6, an organic light emitting layer 8, and a second electrode 9.

The circuit element layer 3 is arranged on one surface of the substrate 2. The circuit element layer 3 may include a plurality of transistors, gate lines, data lines, and subpixels. The subpixels are provided in an area defined by a crossing structure of the gate lines and data lines. The circuit element layer 3 may include transistors per the plurality of subpixel areas. For example, the circuit element layer 3 may include a first transistor 31.

The first transistor 31 is arranged on the first subpixel area 21 in the circuit element layer 3. The first transistor 31 according to one example may be connected to a first sub electrode 61 through a first reflective electrode 51 arranged on the first subpixel area 21 to apply a driving voltage for emitting light of a color corresponding to the first subpixel area 21.

The first subpixel area 21 according to one example provides an organic light emitting diode with a predetermined current in accordance with a data voltage of a data line when a gate signal from a gate line is input thereto using the first transistor 31. For this reason, the organic light emitting diode of the first subpixel area 21 may emit light with predetermined brightness in accordance with a predetermined current.

The insulating layer 4 may be provided on the substrate 2. In more detail, the insulating layer 4 may be arranged on the circuit element layer 3 arranged on the substrate 2.

The insulating layer 4 may include a recessed portion 41 provided on the first subpixel area 21. The recessed portion 41, as shown in FIG. 2A, may be formed to overlap the first transistor 31. The recessed portion 41 may formed by patterning the insulating layer 4 arranged on the first subpixel area 21 using a lift-off or dry etching process. The recessed portion 41 may be formed on the first subpixel area 21 in a recessed shape toward the substrate 2 from the organic light emitting layer 7.

The recessed portion 41 may be formed in a recessed shape of the insulating layer 4 so that the reflective electrode 5 arranged on the recessed portion 41 may reflect light toward the first subpixel area 21. The insulating layer 4 having the recessed portion 41 is provided separately from the circuit element layer 3 but is not limited to this example. The recessed portion 41 may be formed by patterning the circuit element layer 3 without the insulating layer 4. In this case, since the overall thickness of the display device 1 according to one embodiment of the present disclosure may be reduced, the display device 1 may be embodied in a compact size and embodied to enhance wearability and convenience of movement due to a reduced weight according to the reduced thickness.

The recessed portion 41 may be formed on the insulating layer 4 through various patterning methods without limitation to the patterning method such as lift-off or dry etching.

The insulating layer 4 including the recessed portion 41 may be formed on the circuit element layer 3 through a deposition method.

The recessed portion 41 may be provided with N stages (N is an integer greater than 1). For example, the recessed portion 41 may be provided in two stages or more, and may be provided with three stages as shown in FIG. 2A. Among first, second and third stages, the first stage may be arranged to be closest to the substrate 2.

The recessed portion 41 may be provided with three stages or more by a process of one time using a half tone mask. The same recessed portion as the recessed portion 41 may be provided even in the plurality of subpixel areas adjacent to the first subpixel area 21, and these recessed portions may be formed at the same time.

The recessed portion 41 may be a contact hole for connecting the reflective electrode 5 or the first electrode 6 to the first transistor 31 which may be provided with multiple stages and used as a light emitting area to improve light efficiency.

The recessed portion 41 may include a plurality of recessed bottom surfaces 41a parallel with the substrate 2, and a plurality of recessed sides 41b inclined with respect to the substrate 2.

The plurality of recessed bottom surfaces 41a may include a first stage recessed bottom surface 41aa, a second stage recessed bottom surface 41ab, and a third stage recessed bottom surface 41ac. The plurality of recessed sides 41b may include a first stage recessed side 41ba, a second stage recessed side 41bb, and a third stage recessed side 41bc.

The first stage recessed bottom surface 41aa may be in contact with the circuit element layer 3. A through hole 3a may be formed in the first stage recessed bottom surface 41aa. The through hole 3a is to connect the reflective electrode 5 arranged on the recessed portion 41 to the first transistor 31 to overlap the first transistor 31, and may be formed to pass through the circuit element layer 3. As shown in FIG. 2A, the plurality of recessed bottom surfaces 41a and the plurality of recessed sides 41b may be provided to be symmetrical with each other based on the through hole 3a.

The first stage recessed side 41ba may be connected to the first stage recessed bottom surface 41aa. The first stage recessed side 41ba may be provided with a pair of first stage recessed sides 41ba to be connected with both ends of the first stage recessed bottom surfaces 41aa. The first stage recessed side 41ba may form a first angle $\theta1$ with respect to the substrate 2, wherein the first angle $\theta1$ may range from 20° to 70°. Preferably, the first angle $\theta1$ may range from 50° to 55°. In this case, the expression that the first stage recessed side 41ba is provided with a pair of first stage recessed sides 41ba may mean that two elements are provided in a symmetrical shape.

The second stage recessed bottom surface 41ab may be provided with a pair of second stage recessed bottom surfaces 41ab and connected to an end of each of the pair of first stage recessed sides 41ba which are not connected to the first stage recessed bottom surface 41aa. The second stage recessed bottom surface 41ab may be arranged on a position higher than the first stage recessed bottom surface 41aa.

The second stage recessed side 41bb may be provided with a pair of second stage recessed sides 41bb and connected to an end of each of the second stage recessed bottom surfaces 41ab which are not connected to the first stage recessed side 41ba. The second stage recessed side 41bb may form a first angle $\theta1$ with respect to the substrate 2 in the same manner as the first stage recessed side 41ba.

The third stage recessed bottom surface 41ac may be provided with a pair of third stage recessed bottom surfaces 41ac and connected to an end of each of the pair of second stage recessed sides 41bb which are not connected to the second stage recessed bottom surface 41ab. The third stage recessed bottom surface 41ac may be arranged on a position higher than the second stage recessed bottom surface 41ab.

The third stage recessed side 41bc may be provided with a pair of third stage recessed sides 41bc and connected to an end of each of the pair of third stage recessed bottom surfaces 41ac which are not connected to the second stage recessed side 41bb. The third stage recessed side 41bc may form a first angle $\theta1$ with respect to the substrate 2 in the same manner as the second stage recessed side 41bb.

Therefore, the plurality of recessed bottom surfaces 41a may be arranged at different heights, and the plurality of recessed sides 41b may be spaced apart from one another at different distances. A spaced distance between the pair of recessed sides 41b at each stage may be increased as the recessed sides become far away from the substrate 2. Therefore, in the display device 1 according to one embodiment of the present disclosure, an aperture ratio may be increased.

Since the pair of recessed bottom surfaces of each stage have the same length and the pair of recessed sides of each stage have the same first angle $\theta1$ with respect to the substrate 2, the plurality of recessed bottom surfaces 41a and the plurality of recessed sides 41b may be arranged to be symmetrical with each other based on the through hole 3a.

The reflective electrode 5 may be provided in the recessed portion 41 on the insulating layer 4. The reflective electrode 5 is to reflect light emitted from the organic light emitting layer 8 of the first subpixel area 21. The reflective electrode 5 may include a reflective material to reflect light. For example, the reflective material may be, but not limited to, a metal, and may be other materials as long as they reflect light.

Since the reflective electrode 5 is arranged on a place relatively than the organic light emitting layer 8 emitting light, the reflective electrode 5 may reflect light emitted from the organic light emitting layer 8 toward the upper side. In this case, the upper side means a direction where a user can recognize light, for example, it may mean the direction where the encapsulation layer 10 is arranged. Therefore, in a plurality of subpixel areas including the first subpixel 21, light efficiency may be more improved than the case where the reflective electrode 5 is not provided, and a user may recognize an image of high luminance, that is, a clear image through the enhanced light efficiency.

The reflective electrode 5 may be provided with multiple stages as the recessed portion 41 is provided with N stages, that is, multiple stages. For example, the reflective electrode 5, as shown in FIG. 2A, may be provided with three stages.

The reflective electrode 5 may be in contact with the first transistor 31 through the through hole 3a. The reflective electrode 5 may include a plurality of first reflective electrodes 51 parallel with the substrate 2 and a plurality of second reflective electrodes 52 inclined with respect to the substrate 2.

The plurality of first reflective electrodes 51 may be arranged at different heights based on the substrate 2. In this case, the heights may mean the spaced distance from the substrate 2 toward the encapsulation layer 10.

The first reflective electrode 51 may be arranged on the first subpixel area 21 to reflect light emitted from the organic light emitting layer 8. In more detail, the first reflective electrode 51 may include a first parallel portion 511 which is in contact with the first stage recessed bottom surface 41*aa*, a second parallel portion 512 which is in contact with the second stage recessed bottom surface 41*ab*, and a third parallel portion 513 which is in contact with the third stage recessed bottom surface 41*ac*. The first parallel portion 511 may be in contact with the first stage recessed bottom surface 41*aa* and connected to the first transistor 31 through the through hole 3*a*. The through hole 3*a* may be arranged at the center of the first parallel portion 511. The second parallel portion 512 and the third parallel portion 513 may be provided in pairs. The first parallel portion 511, the second parallel portion 512 and the third parallel portion 513 may be arranged at their respective heights different from one another.

The second reflective electrode 52 may be arranged on the first subpixel area 21 to reflect light emitted from the organic light emitting layer 8. In more detail, the second reflective electrode 52 may include a first inclined portion 521 which is in contact with the first stage recessed side 41*ba*, a second inclined portion 522 which is in contact with the second stage recessed side 41*bb*, and a third inclined portion 523 which is in contact with the third stage recessed side 41*bc*. The first inclined portion 521, the second inclined portion 522 and the third inclined portion 523 may be provided in pairs, and may have their respective spaced distances different from each other. The spaced distance of each of the pair of first inclined portions 521, the pair of second inclined portions 522 and the pair of third inclined portions 523 may be increased at a longer distance from the substrate 2.

The pair of second parallel portions 512 and the pair of the third parallel portions 513 of each stage may be provided to have the same length, and the pair of first inclined portions 521, the pair of second inclined portions 522 and the pair of third inclined portions 523 of each stage may be provided to have the same length and form the first angle θ1 with respect to the substrate 2. Therefore, the first parallel portion 511 and the pair of first inclined portions 521, the pair of second parallel portions 512 and the second inclined portion 522, and the pair of third parallel portions 513 and the third inclined portion 523 may be arranged symmetrically based on the through hole 3*a*.

As described above, the first angle θ1 of the second reflective electrode 52 with respect to the substrate 2 may range from 20° to 70°. Therefore, the second reflective electrode 52 may condense light emitted from the organic light emitting layer 8 while reflecting the light toward the first subpixel area 21. Therefore, a user may recognize an image with improved light efficiency, that is, a clear image. If the first angle θ1 is less than 20°, since the second reflective electrode 52 too lies down with respect to the substrate 2, a reflective area where the second reflective electrode 52 reflects light is more widened than the case that the first angle θ1 is 20° or more, that is, light is spread, whereby luminance of light may be deteriorated. Therefore, the user may recognize a blurred image.

If the first angle θ1 exceeds 70°, the second reflective electrode 52 is too erect with respect to the substrate 2, whereby the second reflective electrode 52 reflects light toward another subpixel area adjacent to the first subpixel area 21 as compared with the case that the first angle θ1 is 70° or less. For this reason, a problem occurs in that a color mixture occurs.

The expression that the second reflective electrode 52 lies down means that the second reflective electrode 52 is arranged to be close to an angle parallel with the substrate 2, that is, 0° based on the substrate 2. The expression that the second reflective electrode 52 is erect means that the second reflective electrode 52 is arranged to be close to an angle vertical to the substrate 2, that is, 90° based on the substrate 2.

Therefore, the display device 1 according to one embodiment of the present disclosure may be provided such that the second reflective electrode 52 forms the first angle θ1, whereby a color mixture may be avoided and a clear image may be provided to a user. The first angle θ1 may range from 20° to 70°, preferably 50° to 55°.

The first electrode 6 is provided on the reflective electrode 5 while being overlapped with the recessed portion 41. The first electrode 6 according to one example may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). The first electrode 6 may be an anode. The first electrode 6 may include a first sub electrode 61 and a second sub electrode 62.

The first sub electrode 61 may be provided on the first subpixel area 21. The first sub electrode 61 may be in contact with the first reflective electrode 51. In more detail, the first sub electrode 61 may be connected to the first parallel portion 511 of the first reflective electrode 51 connected to the first transistor 31 through the through hole 3*a*. Therefore, the first sub electrode 61 may be arranged in parallel with the substrate 2, whereby the driving voltage applied from the first transistor 31 may be transferred to the first sub electrode 61 through the first parallel portion 511.

The first sub electrode 61 may be provided with a plurality of first sub electrodes which may be in contact with each of the first reflective electrodes 51. The first sub electrodes 61 may include a first parallel electrode 611 which is in contact with the first parallel portion 511, a pair of second parallel electrodes 612 which are in contact with the second parallel portion 512, and a pair of third parallel electrodes 613 which are in contact with the third parallel portion 513. The pair of second parallel electrodes 612 may have the same length, and the pair of third parallel electrodes 613 may have the same length.

Likewise, the second sub electrode 62 may be provided with a plurality of second sub electrodes which may be in contact with each of the second reflective electrodes 52. The second sub electrodes 62 may include a pair of first inclined electrodes 621 which are in contact with the first inclined portion 521, a pair of second inclined electrodes 622 which are in contact with the second inclined portion 522, and a pair of third inclined electrodes 623 which are in contact with the third inclined portion 523. The pair of first inclined electrodes 621 may have the same length, the pair of second inclined electrodes 622 may have the same length, and the pair of third inclined electrodes 623 may have the same length.

Also, each of the pair of first inclined electrodes 621, the pair of second inclined electrodes 622 and the pair of third inclined electrodes 623 may be provided to have the first angle θ1 with respect to the substrate 2. Therefore, the first parallel electrode 611 and the pair of first inclined electrodes 621, the pair of second parallel electrodes 612 and the pair of second inclined electrodes 622, and the pair of third parallel electrodes 613 and the pair of third inclined electrodes 623 may be arranged symmetrically based on the through hole 3*a*.

The plurality of second sub electrodes 62 may be spaced apart from one another at a first spaced distance D1. For example, the pair of first inclined electrodes 621, the pair of second inclined electrodes 622, and the pair of third inclined electrodes 623 may be spaced apart from each other at the first spaced distance D1. The first spaced distance D1 may mean a distance between the uppermost ends of each of the pair of first, second and third inclined electrodes 621, 622 and 623.

The first spaced distance D1 may be increased at a longer distance from the substrate 2. In this case, the direction at a longer distance from the substrate 2 may be a direction toward the encapsulation layer 10 from the substrate 2. Therefore, the first spaced distance D1 may gradually be increased toward the pair of first inclined electrodes 621, the pair of second inclined electrodes 622, and the pair of third inclined electrodes 623. In this case, since an aperture ratio of the recessed portion 41 is gradually increased toward the upper side, light efficiency may be improved.

The first spaced distance D1 may be at least 0.14 μm or more. Since the first spaced distance D1 is the shortest in the pair of first inclined electrodes 621, the first spaced distance D1 of the pair of first inclined electrodes 621 arranged on first stage may be 0.14 μm or more.

If the first spaced distance D1 of the pair of first inclined electrodes 621 is less than 0.14 μm, the organic light emitting layers 8 which are respectively in contact with the pair of first inclined electrodes 621 may be connected with each other. In this case, since the second electrode 9 arranged on the organic light emitting layer 8 overlapped with the first parallel electrode 611 is provided in a shape parallel with the substrate 2 without being provided in a recessed shape, a spaced distance between the second electrode 9 and the pair of first inclined electrodes 621 is different from a spaced distance between the second electrode 9 and the first parallel electrode 611. Therefore, a problem occurs in that light emission from the organic light emitting layers 8 is not uniform. In this respect, in the display device 1 according to one embodiment of the present disclosure, as the first spaced distance D1 is provided at 0.14 μm or more, the spaced distance between the second electrode 9 and the first electrode 6, that is, the thickness of the organic light emitting layer 8 is maintained uniformly to uniformly distribute a light emitting area, whereby light emission efficiency may be improved.

Referring to FIGS. 1 and 2A, the bank 7 is provided between the plurality of subpixel areas while covering an end of the first electrode 6. For example, the bank 7 may be provided between the first subpixel area 21 and a second subpixel area (not shown) adjacent to the first subpixel area 21.

The bank 7 may be included in a bank area (area with slashes in FIG. 1) surrounding the first electrode 6. The bank 7 according to one example is to partition the first subpixel area 21 from the second subpixel area. The bank 7 serves to define a subpixel area, that is, a light emitting portion. Also, since an area where the bank 7 is formed does not emit light, the area may be defined as a non-light emitting portion. The bank 7 may be formed of an organic film such as acryl resin, epoxy resin, phenolic resin, polyamide resin, and polyimide resin. The organic light emitting layer 8 is formed on the first electrode 6 and the bank 7.

With reference to FIG. 2A, the bank 7 may include a bank top surface 71 and a bank inclined surface 72.

The bank top surface 71 of the bank 7 is a surface arranged on the upper side in the bank 7.

The bank inclined surface 72 of the bank 7 is a surface extended from the bank top surface 71 to a top surface of each of the pair of third parallel electrodes 613. Therefore, the bank inclined surface 72 and the top surface of each of the pair of third parallel electrodes 613 may have a predetermined angle. The predetermined angle may be 50° or more and less than 55° as a width of the bank becomes narrow due to high resolution of the display device. The width of the bank may become narrow as a distance between subpixel areas becomes narrow. The predetermined angle may be the first angle θ1. Therefore, in the display device 1 according to one embodiment of the present disclosure, light emitted from the first subpixel area 21 may not be totally reflected to the bank 7 and may enter the inside of the bank 7. Therefore, as the display device 1 according to one embodiment of the present disclosure comprises the second reflective electrode 52 to emit light entering the bank 7 to the outside of the bank 7, the second reflective electrode 52 may reflect light emitted from the organic light emitting layer 8 of each stage, moving to the bank 7 to emit the light to the first subpixel area 21.

The organic light emitting layer 8 is provided on the first electrode 6. The organic light emitting layer 8 according to one example is a common layer commonly formed on a plurality of subpixel areas including the first subpixel area 21, and may be a white light emitting layer emitting white light. In this case, the organic light emitting layer 8 may be formed with a tandem structure including more than 2 stacks. Each of the stacks may include a hole transporting layer (HTL), at least one light emitting layer, and an electron transporting layer (ETL). When a high potential voltage is applied to the first electrode 6 and a low potential voltage is applied to the second electrode 9, holes and electrons are transferred to the organic light emitting layer 8 through the hole transporting layer and the electron transporting layer, respectively and are combined with each other in the organic light emitting layer 8 to emit light.

For example, the organic light emitting layer 8 is comprised of a plurality of organic layers, wherein the plurality of organic layers include a first stack, a second stack, and a charge generating layer provided between the first stack and the second stack. The first stack may include a first hole transporting layer, a first light emitting layer emitting light of a first color, and a first electron transporting layer. The second stack may include a second hole transporting layer, a second light emitting layer emitting light of a second color, and a second electron transporting layer.

Also, the charge generating layer may be formed between the stacks. The charge generating layer may include an n-type charge generating layer arranged to be adjacent to the first stack and a p-type charge generating layer formed on the n-type charge generating layer and arranged to be adjacent to the second stack. The n-type charge generating layer injects electrons into the first stack, and the p-type charge generating layer injects holes into the second stack. The n-type charge generating layer may be comprised of an organic layer doped with alkali metal such as Li, Na, K, or Cs or alkali earth metal such as Mg, Sr, Ba, or Ra. The p-type charge generating layer may be made by doping a dopant on an organic material that is capable of transporting holes.

The organic light emitting layer 8 may include a plurality of first organic light emitting layers 81 which are in contact with the first sub electrodes 61, and a plurality of second organic light emitting layers 82 which are in contact with the second sub electrodes 62. The plurality of first organic light emitting layers 81 and the plurality of second organic light emitting layers 82 may be connected to each other. Since the first organic light emitting layers 81 are in contact with the first sub electrodes 61, the first organic light emitting layers 81 may be arranged in parallel with the substrate 2. Since the second organic light emitting layers 82 are in contact with the second sub electrodes 62, the second organic light emitting layers 82 may be arranged to be inclined with respect to the substrate 2, wherein the inclined angle may be a first angle θ1. The first angle θ1 may range from 20° to 70°, preferably 50° to 55°.

The first organic light emitting layers 81 may be formed to be thicker than the second organic light emitting layers 82. Since the second organic light emitting layers 82 are arranged at the first angle θ1 due to the first electrode 6 which is arranged at the first angle θ1 corresponding to 20° to 70° with respect to the substrate 2 when the organic light emitting layer 8 is deposited on the first electrode 6, the second organic light emitting layers 82 may be thinner than the first organic light emitting layers 81 arranged in parallel with the substrate 2. That is, the first organic light emitting layers 81 may be thicker than the second organic light emitting layers 82. For example, the first organic light emitting layers 81 may be thicker than the second organic light emitting layers 82 as much as 50% or more. If the angle of the second organic light emitting layer 82 is 90° or less by exceeding 70° with respect to the substrate 2, the thickness of the second organic light emitting layer 82 which is in contact with the second sub electrodes 62 is remarkably reduced when the organic light emitting layer 8 is deposited on the first electrode 6, whereby a problem occurs in that unstable driving is caused. Therefore, the display device 1 according to one embodiment of the present disclosure comprises the first electrode 6 so that the angle of the second organic light emitting layers 82 ranges from 20° to 70° with respect to the substrate 2, whereby luminance may be prevented from being reduced due to light spread in the first subpixel area 21 and the thickness of the second organic light emitting layer 82 may be prevented from being remarkably reduced to avoid unstable driving according to current concentration.

The second electrode 9 is provided on the organic light emitting layer 8. The second electrode 9 according to one example is a common layer commonly formed on the plurality of subpixel areas including the first subpixel area 21. In more detail, the second electrode 9 may be formed to be in contact with the first organic light emitting layer 81 arranged on the recessed portion 41, the second organic light emitting layer 82 and the other organic light emitting layers 8 arranged on a place except the recessed portion 41. The second electrode 9 may be formed of a transparent conductive materials (TCO) such as ITO and IZO that are capable of transmitting light or a semi-transmissive conductive material such as Mg, Ag, or an alloy of Mg and Ag.

The encapsulation layer 10 may be formed on the second electrode 9. The encapsulation layer 10 serves to prevent oxygen or water from being permeated into the organic light emitting layer 8 and the second electrode 9. To this end, the encapsulation layer 10 may include at least one inorganic film and at least one organic film.

For example, the encapsulation layer 10 may include a first inorganic film, an organic film, and a second inorganic film. In this case, the first inorganic film is formed to cover the second electrode 9. The organic film is formed to cover the first inorganic film. It is preferable that the organic film is formed at a sufficient thickness to prevent particles from being permeated into the organic light emitting layer 8 and the second electrode 9 by passing through the first inorganic film. The second inorganic film is formed to cover the organic film.

In FIG. 2A, only up to the encapsulation layer 10 arranged on the second electrode 9 is shown for convenience of description. In the case that an organic light emitting diode includes only white organic light emitting diode, red, green and blue color filters may be arranged on the encapsulation layer 10 to embody red, green and blue colors. In this case, a black matrix (BM) may be arranged between the color filters to partition the color filters. In the case that the organic light emitting diode includes red, green and blue organic light emitting diodes to emit light of red, green and blue colors, the red, green and blue color filters may not be arranged on the encapsulation layer 10.

Hereinafter, the reason why the recessed portion 41, the reflective electrode 5 and the first electrode 6 of the display device 1 according to one embodiment of the present disclosure are provided with N stages (N is an integer greater than 1), that is, multiple stages will be described with reference to a light path shown in FIG. 2A.

First of all, light emitted from each of the first organic light emitting layer 81 and the second organic light emitting layer 82 arranged on first stage closest to the substrate 2 may include direct light headed for the first subpixel area 21 in a direction vertical to the substrate 2 or a direction close to the vertical direction and side light headed for the pair of first inclined portions 521. The direct light may be the other light except the side light. Since the direct light of first stage is emitted from the deepest position of the recessed portion 41 but is emitted to the first subpixel area 21, it may contribute to enhancement of light efficiency. The side light of first stage may move to the first inclined portion 521 by a wave guide of the first organic light emitting layer 81 arranged on first stage, or light may be emitted from an edge portion of the first organic light emitting layer 81 or the second organic light emitting layer 82 arranged on first stage and move to the first inclined portion 521. The side light of first stage may enter the first inclined electrode 621, may be reflected to the first inclined portion 521 and then emitted to the outside of the first inclined electrode 621. In this case, since the first inclined portion 521 has a first angle θ1 with respect to the substrate 2, the light reflected to the first inclined portion 521 may be emitted to the first subpixel area 21.

In connection with the light path, as shown in FIG. 2A, as the position where light is emitted from the first organic light emitting layer 81 of first stage is close to any one of the pair of first inclined portions 521 of the second reflective electrode 52, light efficiency may be enhanced.

For example, in the case that the reflective electrode 5 is provided at an edge portion of a light emitting area of 165 μm*165 μm, light efficiency may be more improved than the case that the reflective electrode 5 is not provided, as much as 10%. In the case that the reflective electrode 5 is provided at an edge portion of a light emitting area of 50 μm*200 μm, light efficiency may be more improved than the case that the reflective electrode 5 is not provided, as much as 18% to 25%. In the case that the reflective electrode 5 is provided at an edge portion of a light emitting area of 50 μm*50 μm, light efficiency may be more improved than the case that the reflective electrode 5 is not provided, as much as 46% to 70%. This means that light efficiency is increased as the light emitting position is close to the reflective electrode 5.

Therefore, in the display device 1 according to one embodiment of the present disclosure, as the distance between the light emitting position of light in the organic light emitting layer 8 and the reflective electrode 5 is reduced as much as possible, efficiency of light emitted to the first subpixel area 21 may be enhanced. In this case, the first spaced distance D1 of the pair of inclined electrodes 621 which are in contact with the pair of first inclined portions 521 may be at least 0.14 μm or more. Although the light path is shown based on the first organic light emitting layer 81 of first stage in FIG. 2A, it is natural that light emitted from the second organic light emitting layer 82 of first stage is reflected to the first parallel portion 511 of the first reflective electrode 51 of first stage and emitted to the first subpixel area 21. Therefore, a detailed description of the light path will be omitted.

Then, light emitted from each of the first organic light emitting layer 81 and the second organic light emitting layer 82 arranged on stages higher than first stage may include direct light headed for the first subpixel area 21 in a direction vertical to the substrate 2 or a direction close to the vertical direction and side light headed for the pair of second inclined portions 522. The direct light may be the other light except the side light. Since the direct light of second stage is emitted from the position higher than first stage to the first subpixel area 21, it may contribute to enhancement of light efficiency. The side light of second stage may move to the second inclined portion 522 by a wave guide of the first organic light emitting layer 81 arranged on second stage, or light may be emitted from an edge portion of the first organic light emitting layer 81 or the second organic light emitting layer 82 arranged on second stage and move to the second inclined portion 522. The side light of second stage may enter the second inclined electrode 622, may be reflected to the second inclined portion 522 and then emitted to the outside of the second inclined electrode 622. In this case, since the second inclined portion 522 has a first angle θ1 with respect to the substrate 2, the light reflected to the second inclined portion 522 may be emitted to the first subpixel area 21.

In connection with the light path, as shown in FIG. 2A, as the position where light is emitted from the first organic light emitting layer 81 of second stage is close to any one of the pair of second inclined portions 522 of the second reflective electrode 52, light efficiency may be enhanced for the same reason for enhancement of light efficiency at first stage. Also, as the position where light is emitted from the second organic light emitting layer 82 of second stage is close to the pair of second parallel portions 512 of the first reflective electrode 51, light efficiency may be enhanced.

Then, light emitted from each of the first organic light emitting layer 81 and the second organic light emitting layer 82 arranged on third stage higher than second stage may include direct light headed for the first subpixel area 21 in a direction vertical to the substrate 2 or a direction close to the vertical direction and side light headed for the pair of third inclined portions 523. The direct light may be the other light except the side light. Since the direct light of third stage is emitted from the position higher than second stage to the first subpixel area 21, it may contribute to enhancement of light efficiency. The side light of third stage may move to the third inclined portion 523 by a wave guide of the first organic light emitting layer 81 arranged on third stage, or light may move from an edge portion of the first organic light emitting layer 81 or the second organic light emitting layer 82 arranged on third stage to the third inclined portion 523. The side light of third stage may enter the third inclined electrode 623, may be reflected to the third inclined portion 523 and then emitted to the outside of the third inclined electrode 623. In this case, since the third inclined portion 523 has a first angle θ1 with respect to the substrate 2, the light reflected to the third inclined portion 523 may be emitted to the first subpixel area 21.

In connection with the light path, as shown in FIG. 2A, as the position where light is emitted from the first organic light emitting layer of third stage is close to any one of the pair of third inclined portions 523 of the second reflective electrode 52, light efficiency may be enhanced for the same reason for enhancement of light efficiency at first stage and second stage. Also, as the position where light is emitted from the second organic light emitting layer 82 of third stage is close to the pair of third parallel portions 513 of the first reflective electrode 51, light efficiency may be enhanced As a result, in the display device 1 according to one embodiment of the present disclosure, as the recessed portion 41, the reflective electrode 5 and the first electrode 6 are provided with multiple stages, the distance between the light emitting position of light in the organic light emitting layer 8 arranged on each stage and the reflective electrode 5 is reduced as much as possible, efficiency of light emitted to the first subpixel area 21 may be enhanced.

Figure 3A:
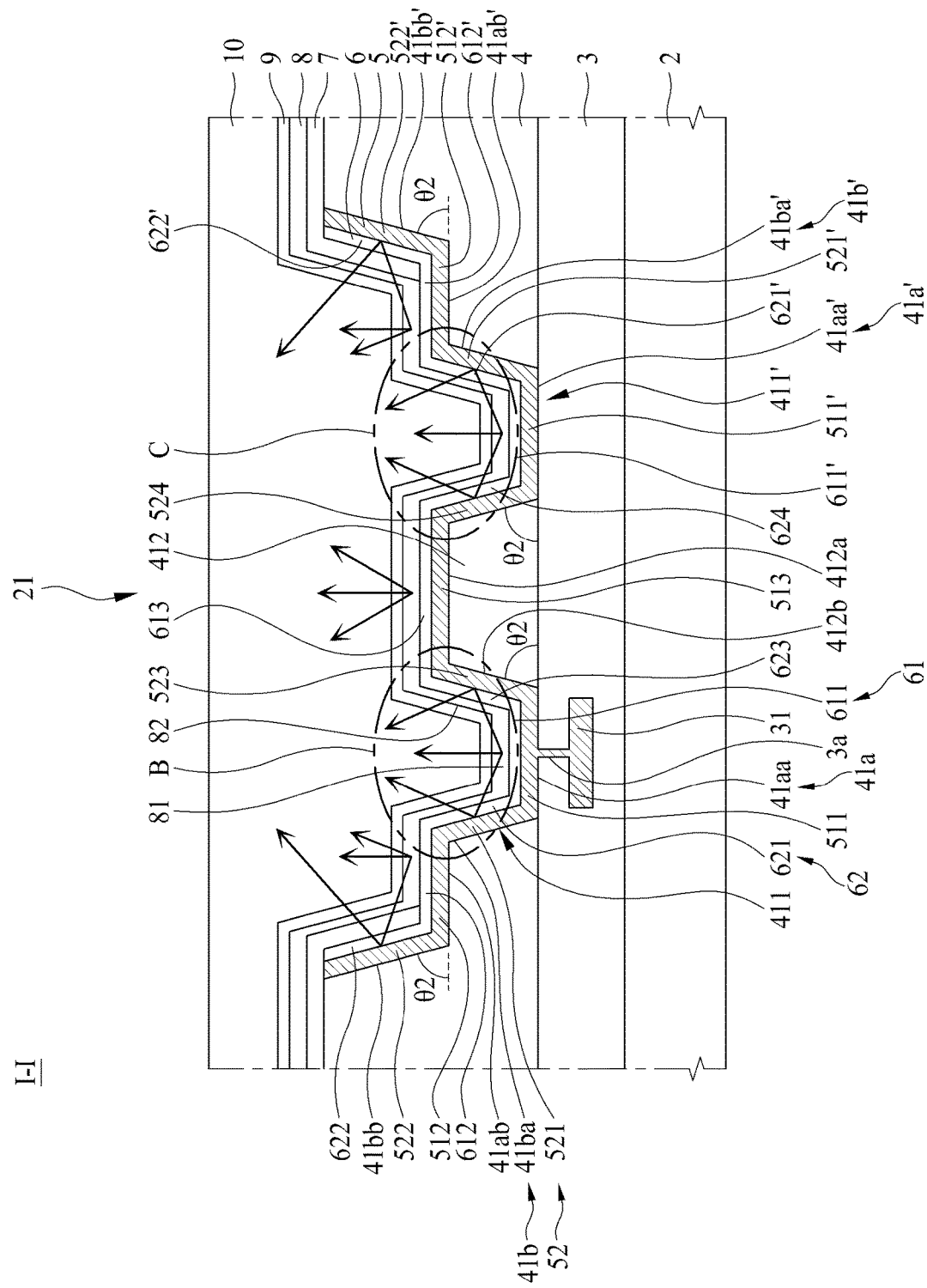
FIG. 3A is a brief cross-sectional view illustrating a display device according to the second embodiment of the present disclosure.
Figure 3B:
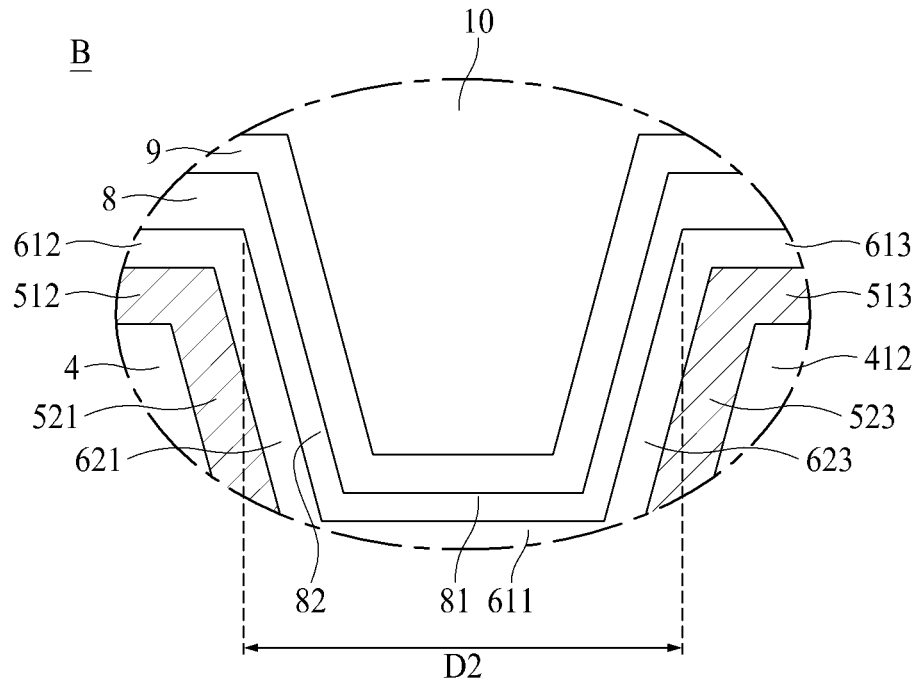
FIG. 3B is a brief enlarged view illustrating a part B shown in FIG. 3A.
Figure 3C:
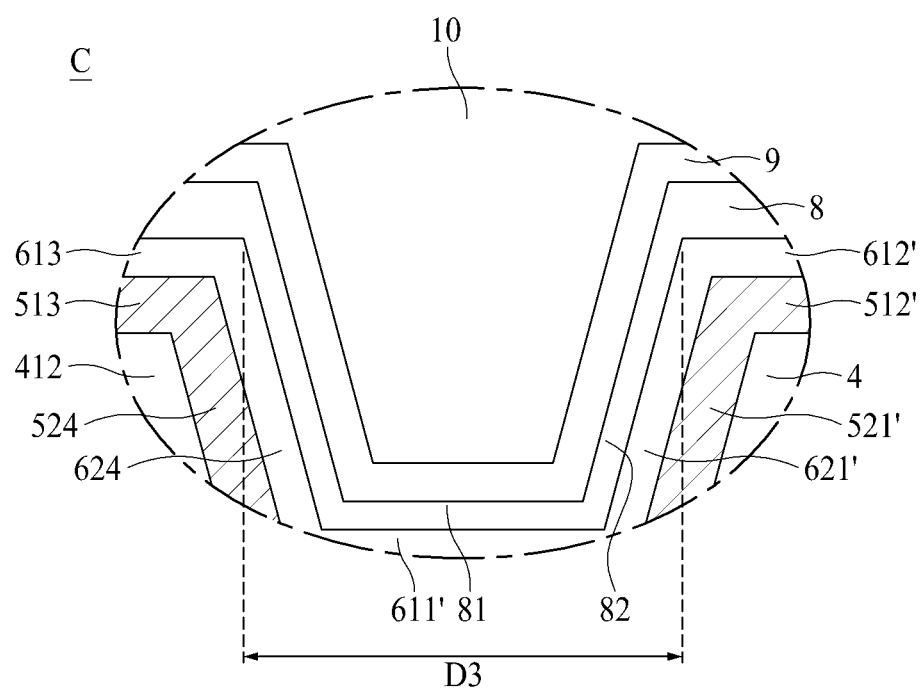
FIG. 3C is a brief enlarged view illustrating a part C shown in FIG. 3A.

FIG. 3A is a brief cross-sectional view illustrating a display device according to the second embodiment of the present disclosure, FIG. 3B is a brief enlarged view illustrating a part B shown in FIG. 3A, and FIG. 3C is a brief enlarged view illustrating a part C shown in FIG. 3A.

Referring to FIGS. 3A to 3C, the display device 1 according to the second embodiment of the present disclosure is the same as the display device 1 according to one embodiment of the present disclosure of FIG. 2A except that the recessed portion 41, the reflective electrode 5 and the first electrode 6 are changed. Therefore, the same reference numbers will be used throughout the drawings to refer to the same or like parts. Hereinafter, the elements different from those of the display device 1 according to one embodiment of the present disclosure will be described.

In the display device according to FIG. 2A, since the recessed portion 41 is formed as one groove and provided with three stages, the reflective electrode 5 and the first electrode 6 arranged on the recessed portion 41 are provided with three stages. Therefore, in the display device according to FIG. 2A, the first spaced distance D1 of each stage of the first electrode 6 is gradually increased at a longer distance from the substrate 2.

On the other hand, in the display device 1 according to FIG. 3A, since the recessed portion 41 is formed as two grooves and provided with two stages, the reflective electrode 5 arranged on the recessed portion 41 and the first electrode 6 are provided with two stages. The recessed portion 41 arranged on first stage of the display device 1 according to FIG. 3A includes a first recessed portion 411, a second recessed portion 411', and a convex portion 412 arranged between the first recessed portion 411 and the second recessed portion 411'. The recessed portion 41 arranged on two stages of the display device 1 according to FIG. 3A is provided in the same type as three stages of the recessed portion 41 of the display device according to FIG. 2A. In the display device 1 according to FIG. 3A, as the convex portion 412 is arranged between the first recessed portion 411 and the second recessed portion 411', an aperture rate of the recessed portion 41 may suddenly be increased if one stage is changed to two stages.

Referring to FIGS. 3A to 3C, the display device 1 according to the second embodiment of the present disclosure includes a first recessed portion 411, a second recessed portion 411', and a convex portion 412.

The first recessed portion 411 and the second recessed portion 411' may be formed in a dented shape of the insulating layer 4 through at least one of various patterning methods and deposition methods in the same manner as the recessed portion 41 of the display device 1 according to one embodiment of the present disclosure. On the other hand, the convex portion 412 may be formed naturally as the first recessed portion 411 and the second recessed portion 411' are formed. The convex portion 412 may be formed by being deposited between the first recessed portion 411 and the second recessed portion 411'.

The first recessed portion 411 and the second recessed portion 411' may be provided with N stages (N is an integer greater than 1). For example, the first recessed portion 411 and the second recessed portion 411' may be provided with two stages as shown in FIG. 3A. The convex portion 412 may be provided to be protruded in a direction opposite to the first and second recessed portions 411 and 411' between the first recessed portion 411 and the second recessed portion 411'. Although the convex portion 412 may be provided with one stage as shown in FIG. 3A, the convex portion 412 may be provided with multiple stages in the same manner as the first and second recessed portions 411 and 411'.

The first recessed portion 411 is arranged at one side of a subpixel area. For example, the first recessed portion 411 may be arranged at the upper side of the first subpixel area 21. Therefore, the first recessed portion 411 may be a light emitting area for allowing the upper side of the first subpixel area 21 to emit light.

The second recessed portion 411' may be arranged at the other side of the first subpixel area 21. The second recessed portion 411' may be a light emitting area for allowing the side of the first subpixel area 21 to emit light. Therefore, the first recessed portion 411 and the second recessed portion 411' may be light emitting areas for allowing one side and the other side, that is, all of the first subpixel area 21 to emit light.

A transistor for applying a driving voltage to the first recessed portion 411 and the second recessed portion 411', for example, the first transistor 31 of the first subpixel area 21 may be provided to overlap any one of the first recessed portion 411 and the second recessed portion 411'.

As shown in FIG. 3A, if the first transistor 31 is arranged to overlap the first recessed portion 411, the first reflective electrode 51 arranged on the first recessed portion 411 may be connected to the first transistor 31 through the through hole 3a.

The first recessed portion 411 may include a plurality of recessed bottom surfaces 41a parallel with the substrate 2, and a plurality of recessed sides 41b inclined with respect to the substrate 2. The plurality of recessed bottom surfaces 41a may include a first stage recessed bottom surface 41aa and a second stage recessed bottom surface 41ab. The plurality of recessed sides 41b may include a first stage recessed side 41ba and a second stage recessed side 41bb.

Since the recessed bottom surface 41a including the first stage recessed bottom surface 41aa and the second stage recessed bottom surface 41ab and the recessed side 41b including the first stage recessed side 41ba and the second stage recessed side 41bb are the same as those of the display device 1 according to one embodiment of the present disclosure except that they are arranged on the first recessed portion 411, their description will be omitted. The elements different from those of the display device 1 according to one embodiment of the present disclosure will be described.

In the display device 1 according to the second embodiment of the present disclosure, if the first transistor 31 is provided to overlap the first recessed portion 411 as shown in FIG. 3A, the first recessed portion 411 and the second recessed portion 411' may be provided symmetrically based on the convex portion 412 except that the reflective electrode 5 arranged on the first recessed portion 411 is connected to the first transistor 31.

The second recessed portion 411' may include a plurality of recessed bottom surfaces 41a' parallel with the substrate 2, and a plurality of recessed sides 41b' inclined with respect to the substrate 2. The plurality of recessed bottom surfaces 41a' may include a first stage recessed bottom surface 41aa' and a second stage recessed bottom surface 41ab'. The plurality of recessed sides 41b' may include a first stage recessed side 41ba' and a second stage recessed side 41bb'.

In the display device 1 according to the second embodiment of the present disclosure, since two recessed portions 41 are provided, the first stage recessed bottom surface 41aa and the first stage recessed bottom surface 41aa' may be provided in pairs unlike the display device 1 according to one embodiment of the present disclosure, and the first stage recessed bottom surface 41aa and the first stage recessed bottom surface 41aa' may be provided to be symmetrical with each other except that the through hole 3a for connecting the reflective electrode 5 to the first transistor 31 is formed as described above.

The first stage recessed side 41ba of the first recessed portion 411 and the first stage recessed side 41ba' of the second recessed portion 411' may be provided in pairs, and may be provided symmetrically based on the convex portion 412. Each of the first stage recessed portion 41ba and the first stage recessed side 41ba' may have a second angle θ2 with respect to the substrate 2.

Likewise, each of the second stage recessed bottom surface 41ab and the second stage recessed side 41bb of the first recessed portion 411 and each of the second stage recessed bottom surface 41ab' and the second stage recessed side 41bb' of the second recessed portion 411' may be provided symmetrically based on the convex portion 412. Each of the second stage recessed side 41bb and the second stage recessed side 41bb' may have a second angle θ2 with respect to the substrate 2. The second angle θ2 may range from 20° to 70°, preferably from 50° to 55°.

As a result, the display device 1 according to the second embodiment of the present disclosure may have a similar structure to the display device 1 according to one embodiment of the present disclosure except that the first recessed portion 411 and the second recessed portion 411' are provided with two stages, the convex portion 412 is arranged between the first recessed portion 411 and the second recessed portion 411', and a spaced distance between a light emitting portion at first stage of each of the first recessed portion 411 and the second recessed portion 411' and the reflective electrode 5 may be reduced due to the convex portion 412 arranged on first stage.

The convex portion 412 may include a convex top surface 412a and a convex side 412b. The convex top surface 412a is parallel with the substrate 2, and may be arranged at an upper side of the convex portion 412. The convex top surface 412a may be arranged on a relatively higher position than the first stage recessed bottom surface 41aa and the first stage recessed bottom surface 41aa'.

The convex side 412b is inclined toward the substrate 2, and may connect both ends of the convex top surface 412a with a top surface of the circuit element layer 3. The convex side 412b may be provided with a pair of convex sides, which may respectively be arranged toward the first recessed portion 411 and the second recessed portion 411'. The pair of convex sides 412b may be provided symmetrically.

The reflective electrode 5 is to reflect light emitted from the organic light emitting layer 8 toward the first subpixel area 21, and may include a first reflective electrode 51 parallel with the substrate 2 and a second reflective electrode 52 inclined toward the substrate 2.

The first reflective electrode 51 may include a first parallel portion 511 which is in contact with the first stage recessed bottom surface 41*aa* of the first recessed portion 411, a second parallel portion 512 which is in contact with the second stage recessed bottom surface 41*ab*, a first parallel portion 511' which is in contact with the first stage recessed bottom surface 41*aa*' of the second recessed portion 411', and a second parallel portion 512' which is in contact with the second stage recessed bottom surface 41*ab*' of the second recessed portion 411'.

The first parallel portion 511 and the first parallel portion 511', and the second parallel portion 512 and the second parallel portion 512' may be provided symmetrically based on the convex portion 412.

The first reflective electrode 51 may further include a convex parallel portion 513 which is in contact with the convex top surface 412*a*. The convex parallel portion 513 may be arranged at the same height as that of at least one of the plurality of first reflective electrodes 51 arranged on the first recessed portion 411, that is, the first parallel portion 511 and the second parallel portion 512. For example, as shown in FIG. 3A, the convex parallel portion 513 may be arranged at the same height as that of the second parallel portion 512. Therefore, as the convex portion 412 protruded toward the encapsulation layer 10 may be provided between the first recessed portion 411 and the second recessed portion 411', the spaced distance between the light emitting position of each of the first recessed portion 411 and the second recessed portion 411' at first stage and the reflective electrode 5 may be reduced, whereby light efficiency may be enhanced.

The second reflective electrode 52 may include a first recessed reflective electrode arranged on the first recessed portion 411 and a second recessed reflective electrode arranged on the second recessed portion 411'.

The first recessed reflective electrode may include a first inclined portion 521 which is in contact with the first stage recessed side 41*ba* of the first recessed portion 411 and a second inclined portion 522 which is in contact with the second stage recessed side 41*bb*.

The second recessed reflective electrode may include a first inclined portion 521' which is in contact with the first stage recessed side 41*ba*' of the second recessed portion 411' and a second inclined portion 522' which is in contact with the second stage recessed side 41*bb*'.

The first inclined portion 521 and the first inclined portion 521', and the second inclined portion 522 and the second inclined portion 522' may be provided symmetrically based on the convex portion 412.

Each of the first inclined portion 521, the first inclined portion 521', the second inclined portion 522 and the second inclined portion 522' of the second reflective electrode 52 may have a second angle θ2 with respect to the substrate 2. The second angle θ2 may range from 20° to 70°, preferably from 50° to 55°.

If the second angle θ2 is less than 20°, since the second reflective electrode 52 too lies down with respect to the substrate 2, a reflective area where the second reflective electrode 52 reflects light is more widened than the case that the second angle θ2 is 20° or more, that is, light is spread, whereby luminance of light may be deteriorated. Therefore, the user may recognize a blurred image.

If the second angle θ2 exceeds 70°, the second reflective electrode 52 is too erect with respect to the substrate 2, whereby the second reflective electrode 52 reflects light toward another subpixel area adjacent to the first subpixel area 21 as compared with the case that the second angle θ2 is 70° or less. For this reason, a problem occurs in that a color mixture occurs.

The expression that the second reflective electrode 52 lies down means that the second reflective electrode 52 is arranged to be close to an angle parallel with the substrate 2, that is, 0° based on the substrate 2. The expression that the second reflective electrode 52 is erect means that the second reflective electrode 52 is arranged to be close to an angle vertical to the substrate 2, that is, 90° based on the substrate 2.

The second reflective electrode 52 may include a first convex reflective electrode 523 arranged on the convex portion 412 to face the first inclined portion 521 of the first recessed reflective electrode, and a second convex reflective electrode 524 arranged on the convex portion 412 to face the first inclined portion 521' of the second recessed reflective electrode.

Each of the first convex reflective electrode 523 and the second convex reflective electrode 524 may be in contact with the convex side 412*b* to reflect light of the organic light emitting layer 8 to the first subpixel area 21.

The first inclined portion 521 and the first convex reflective electrode 523 may be provided symmetrically based on the first parallel portion 511, and the first inclined portion 521' and the second convex reflective electrode 524 may be provided symmetrically based on the first parallel portion 511'.

The first electrode 6 is an anode, and is provided on the reflective electrode 5 while being overlapped with the first recessed portion 411, the second recessed portion 411' and the convex portion 412. The first electrode 6 may include a first sub electrode 61 which is in contact with the first reflective electrode 51, and a second sub electrode 62 which is in contact with the second reflective electrode 52. The first sub electrode 61 and the second sub electrode 62 may be connected to one electrode.

The first sub electrode 61 may include a first parallel electrode 611 which is in contact with the first parallel portion 511, a second parallel electrode 612 which is in contact with the second parallel portion 512 of the first recessed portion 411, a first parallel electrode 611' which is in contact with the first parallel portion 511' of the second recessed portion 411', and a second parallel electrode 612' which is in contact with the second parallel portion 512' of the second recessed portion 411'. The first sub electrode 61 may further include a convex electrode 613 which is in contact with the convex parallel portion 513 of the convex portion 412.

The second sub electrode 62 may include a first recessed sub electrode 621 which is in contact with the first inclined portion 521 of the first recessed portion 411, a second recessed sub electrode 622 which is in contact with the second inclined portion 522 of the first recessed portion 411, a second sub electrode 621' which is in contact with the first inclined portion 521' of the second recessed portion 411', and a second recessed sub electrode 622' which is in contact with the second inclined portion 522' of the second recessed portion 411'. The second sub electrode 62 may further include a first convex sub electrode 623 which is in contact with the first convex reflective electrode 523 of the convex portion 412, and a second convex sub electrode 624 which is in contact with the second convex reflective electrode 524.

As shown in FIGS. 3B and 3C, the first recessed sub electrode 621 and the first convex sub electrode 623 may be spaced apart from each other at a second spaced distance D2, and the second recessed sub electrode 621' and the second convex sub electrode 624 may be spaced apart from each other at a third spaced distance D3.

The second spaced distance D2 and the third spaced distance D3 may be provided in the same manner. The second spaced distance D2 may be 0.14 µm or more. If the second spaced distance D2 is less than 0.14 µm, the organic light emitting layers 8 which are respectively in contact with the first recessed sub electrode 621 and the first convex sub electrode 623 may be connected with each other. In this case, since the second electrode 9 arranged on the organic light emitting layer 8 overlapped with the first parallel electrode 611 is arranged in a shape parallel with the substrate 2 without being formed in a recessed shape, a spaced distance between the first electrode 6 and the second electrode 9 at first stage of the first recessed portion 411, that is, the thickness of the organic light emitting layer 8 is changed, whereby a problem occurs in that light emission from the organic light emitting layers 8 is not uniform. Therefore, in the display device 1 according to the second embodiment of the present disclosure, as the second spaced distance D2 and the third spaced distance D3 equal to the second spaced distance D2 are provided at 0.14 µm or more, the spaced distance between the second electrode 9 and the first electrode 6 at first stage, that is, the thickness of the organic light emitting layer 8 is maintained uniformly to uniformly distribute a light emitting area, whereby light emission efficiency may be enhanced.

Hereinafter, the reason why the first recessed portion 411, the second recessed portion 411', the reflective electrode 5 and the first electrode 6 of the display device 1 according to the second embodiment of the present disclosure are provided with N stages (N is an integer greater than 1), that is, multiple stages will be described with reference to a light path shown in FIG. 3A. Since the first recessed portion 411 and the second recessed portion 411' are provided symmetrically based on the convex portion 412, description of the second recessed portion 411' and the convex portion 412 will be omitted, and description will be given based on the first recessed portion 411 and the convex portion 412.

First of all, light emitted from each of the first organic light emitting layer 81 and the second organic light emitting layer 82 arranged on first stage closest to the substrate 2 may include direct light headed for the first subpixel area 21 in a direction vertical to the substrate 2 or a direction close to the vertical direction and side light headed for the first inclined portion 521 and the first convex reflective electrode 523. The direct light may be the other light except the side light. Since the direct light of first stage is emitted from the deepest position of the first recessed portion 411 but is emitted to the first subpixel area 21, it may contribute to enhancement of light efficiency. The side light of first stage may move to the first inclined portion 521 and the first convex reflective electrode 523 by a wave guide of the first organic light emitting layer 81 arranged on first stage, or light may be emitted from an edge portion of the first organic light emitting layer 81 or the second organic light emitting layer 82 arranged on first stage and move to the first inclined portion 521 and the first convex reflective electrode 523. The side light of first stage may enter the first inclined electrode 621 and the first convex sub electrode 623, may be reflected to the first inclined portion 521 and the first convex reflective electrode 523 and then emitted to the outside of the first inclined electrode 621 and the first convex sub electrode 623. In this case, since the first inclined portion 521 and the first convex reflective electrode 523 have a second angle θ2 with respect to the substrate 2, the light reflected to the first inclined portion 521 and the first convex reflective electrode 523 may be emitted to the first subpixel area 21.

In connection with the light path, as shown in FIG. 3A, as the position where light is emitted from the first organic light emitting layer 81 of first stage is close to any one of the first inclined portion 521 and the first convex reflective electrode 523, light efficiency may be enhanced as described in the display device 1 according to one embodiment of the present disclosure.

Although the light path is shown based on the first organic light emitting layer 81 of first stage in FIG. 3A, it is natural that light emitted from the second organic light emitting layer 82 of first stage is reflected to the first parallel portion 511 of the first reflective electrode 51 of first stage and emitted to the first subpixel area 21. Therefore, a detailed description of the light path will be omitted.

Then, light emitted from each of the first organic light emitting layer 81 and the second organic light emitting layer 82 arranged on second stage higher than first stage may include direct light headed for the first subpixel area 21 in a direction vertical to the substrate 2 or a direction close to the vertical direction and side light headed for the second inclined portion 522. The direct light may be the other light except the side light. Since the direct light of second stage is emitted from the position higher than first stage to the first subpixel area 21, it may contribute to enhancement of light efficiency. The side light of second stage may move to the second inclined portion 522 by a wave guide of the first organic light emitting layer 81 arranged on second stage, or light may be emitted from an edge portion of the first organic light emitting layer 81 or the second organic light emitting layer 82 arranged on second stage and move to the second inclined portion 522. The side light of second stage of the first recessed portion 411 may enter the second inclined electrode 622, may be reflected to the second inclined portion 522 and then emitted to the outside of the second inclined electrode 622. In this case, since the second inclined portion 522 has a second angle θ2 with respect to the substrate 2, the light reflected to the second inclined portion 522 may be emitted to the first subpixel area 21.

In connection with the light path, as shown in FIG. 3A, as the position where light is emitted from the first organic light emitting layer 81 of second stage is close to the second inclined portion 522 of the second reflective electrode 52, light efficiency may be enhanced for the same reason for enhancement of light efficiency at first stage. Also, as the position where light is emitted from the second organic light emitting layer 82 of second stage is close to the second parallel portion 512 of the first reflective electrode 51, light efficiency may be enhanced.

As a result, in the display device 1 according to the second embodiment of the present disclosure, as the first recessed portion 411, the second recessed portion 411', the reflective electrode 5 and the first electrode 6 are provided with multiple stages, and the convex portion 412 is arranged between the first recessed portion 411 and the second recessed portion 411', the distance between the light emitting position of light in the organic light emitting layer 8 arranged on each stage and the reflective electrode 5 is reduced as much as possible, efficiency of light emitted to the first subpixel area 21 may be enhanced.

FIG. 4 is a brief cross-sectional view illustrating a display device according to the third embodiment of the present disclosure.

With reference to FIG. 4, the display device 1 according to the third embodiment of the present disclosure is the same as the display device 1 according to FIG. 3A except that the first reflective electrode 51 provided on the second recessed portion 411' is connected to the first transistor 31. Therefore, the same reference numbers will be used throughout the drawings to refer to the same or like parts. Hereinafter, only the elements different from those of the display device 1 according to FIG. 3A will be described.

In the display device according to FIG. 3A, the first transistor 31 is connected to only the first reflective electrode 51 provided on the first recessed portion 411. Therefore, the driving voltage of the first transistor 31 may be applied from the first reflective electrode 51 of the first recessed portion 411 to the first reflective electrode 51 provided on the second recessed portion 411'.

On the other hand, in the display device according to FIG. 4, the first reflective electrode 51 arranged on each of the first recessed portion 411 and the second recessed portion 411' may be connected to the first transistor 31. In more detail, the first parallel portion 511 provided on the first recessed portion 411 may be connected to the first transistor 31 through the through hole 3a, and the first parallel portion 511' provided on the second recessed portion 411' may be connected to the first transistor 31 through a first through hole 3b and a connection electrode CE.

The first through hole 3b is a hole formed to pass through the circuit element layer 3 overlapped with the second recessed portion 411' so that the first parallel portion 511' may be connected to the first transistor 31. The first parallel portion 511' may be connected to the connection electrode CE arranged on the circuit element layer 3 through the first through hole 3b.

The connection electrode CE is to connect the first transistor 31 with the first parallel portion 511', and may be formed in the circuit element layer 3. The connection electrode CE may be formed of a material that includes a metal material to enhance conductivity for transferring the driving voltage of the first transistor 31 to the first parallel portion 511'.

Therefore, in the display device 1 according to the third embodiment of the present disclosure, since the driving voltage of the first transistor 31 may simultaneously be applied to the first reflective electrodes 51 respectively arranged on the first recessed portion 411 and the second recessed portion 411', it is possible to improve light efficiency while reducing a difference in response of the organic light emitting layers 8 on the first recessed portion 411 and the second recessed portion 411' as compared with the case that the driving voltage is applied to only the first reflective electrode 51 of the first recessed portion 411.

In the display device 1 according to the third embodiment of the present disclosure, the first reflective electrode 51 of the second recessed portion 411' is connected to the first transistor 31 through the connection electrode CE as described above. However, without limitation to this case, a length of the first transistor 31 may be increased to reach the second recessed portion 411' without the connection electrode CE, whereby the first reflective electrode 51 of the second recessed portion 411' may be connected with the first transistor 31.

Figure 5A:
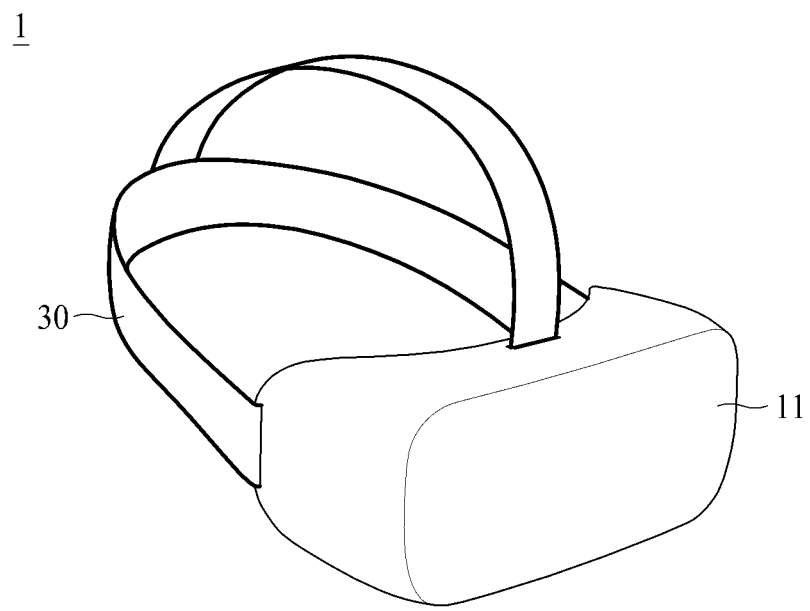
FIGS. 5A to 5C are views illustrating a display device according to another embodiment of the present disclosure, and relate to a head-mounted display (HMD) device.
Figure 5B:
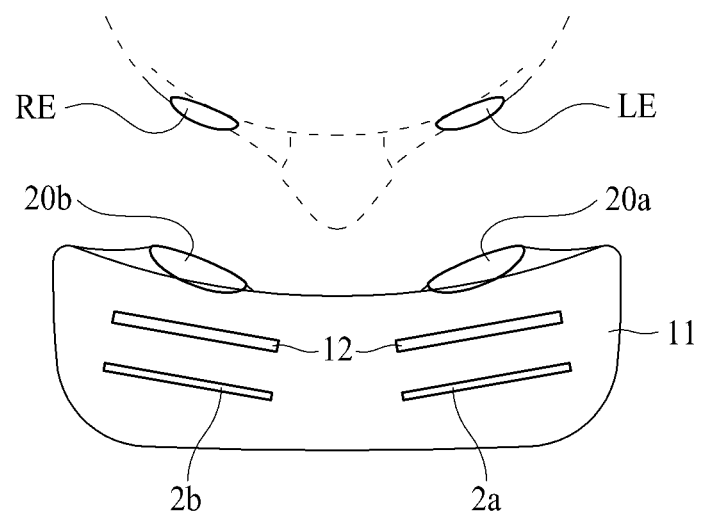
Figure 5C:
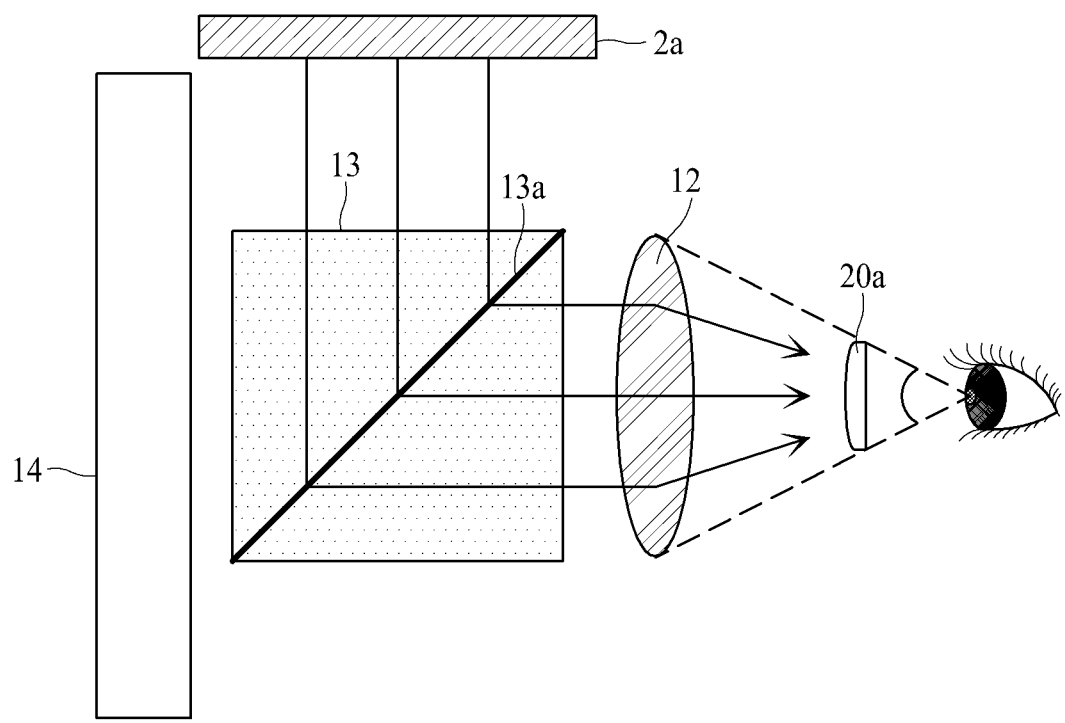

FIGS. 5A to 5C are views illustrating a display device according to another embodiment of the present disclosure, and relate to a head-mounted display (HMD) device. FIG. 5A is brief perspective view of a head-mounted display device, FIG. 5B is a brief plane view of a virtual reality (VR) structure, and FIG. 5C is a brief cross-sectional view of an augmented reality (AR) structure.

As will be aware of it from FIG. 5A, a head mounted display device according to present disclosure comprises a storage case 11 and a head mounted band 30.

The storage case 11 stores elements such as a display device, a lens array, and an ocular lens.

The head mounted band 30 is fixed to the storage case 11. The head mounted band 30 is formed to surround a top surface and both sides of a user's head, but is not limited to this example. The head mounted band 30 is to fix a head mounted display device to a user's head and may be replaced with a structure of a shape of a glasses frame or a helmet shape.

As will be aware of it from FIG. 5B, the head mounted display device 1 of a virtual reality (VR) structure according to the present disclosure may include a left eye display device 2a, a right eye display device 2b, a lens array 12, a left eye ocular lens 20a, and a right eye ocular lens 20b.

The left eye display device 2a, the right eye display device 2b, the lens array 12, the left eye ocular lens 20a and the right eye ocular lens 20b are stored in the storage case 11 described above.

The left eye display device 2a and the right eye display device 2b may display the same image, and in this case, a user may view 2D image. Alternatively, the left eye display device 2a may display a left eye image and the right eye display device 2b may display a right eye image, and in this case, a user may view a 3D image. Each of the left eye display device 2a and the right eye display device 2b may be comprised of a display device according to FIGS. 1 to 4 described above. For example, each of the left eye display device 2a and the right eye display device 2b may be an organic light emitting display device.

Each of the left eye display device 2a and the right eye display device 2b may include a plurality of subpixel areas, an insulating layer 4, a reflective electrode 5, a first electrode 6, a bank 7, an organic light emitting layer 8, a second electrode 9, and an encapsulation layer 10, may display various images by combining colors of light emitted from each of the subpixel areas in various manners.

The lens array 12 may be provided between the left eye ocular lens 20a and the left eye display device 2a by being spaced apart from each of the left eye ocular lens 20a and the left eye display device 2a. That is, the lens array 12 may be arranged in front of the left eye ocular lens 20a and behind the left eye display device 2a. Also, the lens array 12 may be provided between the right eye ocular lens 20b and the right eye display device 2b by being spaced apart from each of the right eye ocular lens 20b and the right eye display device 2b. That is, the lens array 12 may be arranged in front of the right eye ocular lens 20b and behind the right eye display device 2b.

The lens array 12 may be a micro lens array. The lens array 12 may be replaced with a pin hole array. Due to the lens array 12, images displayed on a left eye display device 2a or a right eye display device 2b may be viewed to be magnified to a user.

A left eye LE of a user may be arranged in the left eye ocular lens 20a, and a right eye RE of a user may be arranged in the right eye ocular lens 20b.

As will be aware of it from FIG. 5C, a head mounted display device of an augmented reality (AR) structure according to the present disclosure includes a left eye display device 2a, a lens array 12, a left eye ocular lens 20a, a transmissive reflection portion 13, and a transmissive window 14. Although only a structure for a left eye is shown in FIG. 5C for convenience, a structure for a right eye is the same as the structure for the left eye.

The left eye display device 2a, the lens array 12, the left eye ocular lens 20a, the transmissive reflection portion 13, and the transmissive window 14 are stored in the aforementioned storage case 11.

The left eye display device 2a may be arranged at one side of the transmissive reflection portion 13, for example, at an upper side, without covering the transmissive window 14. Therefore, the left eye display device 2a may provide the transmissive reflection portion 13 with an image without covering an outer background viewed through the transmissive window 14.

The left eye display device 2a may be comprised of an electroluminescence display device according to FIGS. 1 to 4 described above. In this case, the top portion corresponding to the surface where images are displayed in FIGS. 1 to 4, for example, the encapsulation layer 10 or a color filter (not shown) faces the transmissive reflection portion 13.

The lens array 12 may be provided between the left eye ocular lens 20a and the transmissive reflection portion 13.

A left eye of a user is arranged in the left eye ocular lens 20a.

The transmissive reflection portion 13 is arranged between the lens array 12 and the transmissive window 14. The transmissive reflection portion 13 may include a reflection surface 13a which transmits a portion of light and reflects another portion of light. The reflection surface 13a is formed to make an image displayed on the left eye display device 2a to proceed to the lens array 12. Therefore, a user may view all of images displayed on the left eye display device 2a and an outer background through the transmissive window 14. That is, since the user may view one image by overlapping background in reality with virtual images, augmented reality (AR) may be embodied.

The transmissive window 14 is arranged in front of the transmissive reflection portion 13.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device comprising: a substrate provided with a plurality of subpixel areas; a circuit element layer provided on the substrate and provided with a transistor for each subpixel area; an insulating layer provided on the circuit element layer and provided with a recessed portion formed to overlap the transistor in a direction perpendicular to a longest plane of the substrate; a reflective electrode provided on the insulating layer and provided in the recessed portion; a first electrode provided on the reflective electrode while being overlapped with the recessed portion; an organic light emitting layer provided on the first electrode; a bank provided between the subpixel areas while covering an end of the first electrode; and a second electrode provided on the organic light emitting layer, wherein the recessed portion, the reflective electrode and the first electrode are provided with N stages, wherein N is an integer greater than 1.

2. The display device of claim 1, wherein the reflective electrode includes:
a plurality of first reflective electrodes parallel with the substrate; and
a plurality of second reflective electrodes inclined with respect to the substrate.

3. The display device of claim 2, wherein the first reflective electrodes are arranged at their respective heights different from each other based on the substrate.

4. The display device of claim 1, wherein the circuit element layer includes a through hole formed at a portion where the recessed portion is overlapped with the transistor, and the reflective electrode is in contact with the transistor through the through hole.

5. The display device of claim 4, wherein the recessed portion, the reflective electrode and the first electrode are arranged symmetrically based on the through hole.

6. The display device of claim 2, wherein each of the second reflective electrodes has a first angle with the substrate, and the first angle ranges from 20° to 70°.

7. The display device of claim 2, wherein the first electrode includes a plurality of first sub electrodes which are in contact with the first reflective electrodes and a plurality of second sub electrodes which are in contact with the second reflective electrodes, the organic light emitting layer includes a plurality of first organic light emitting layers which are in contact with the first sub electrodes, and a plurality of second organic light emitting layers which are in contact with the second sub electrodes, and the first organic light emitting layers are thicker than the second organic light emitting layers.

8. The display device of claim 7, wherein the second sub electrodes are spaced apart from each other at a first spaced distance which is increased at a longer distance from the substrate.

9. The display device of claim 8, wherein the first spaced distance is 0.14 in or more.

10. The display device of claim 3, wherein the recessed portion includes:
a first recessed portion arranged at one side of the subpixel area;
a second recessed portion arranged at the other side of the subpixel area; and
a convex portion arranged between the first recessed portion and the second recessed portion.

11. The display device of claim 10, wherein each of the second reflective electrodes respectively arranged on the first and second recessed portions and the convex portion has a second angle with the substrate, and the second angle ranges from 20° to 70°.

12. The display device of claim 10, wherein the transistor is provided to overlap any one of the first recessed portion and the second recessed portion.

13. The display device of claim 12, wherein the first reflective electrode arranged on each of the first recessed portion and the second recessed portion is connected to the transistor.

14. The display device of claim 10, wherein the first reflective electrode arranged on the convex portion is arranged at the same height as that of at least one of the plurality of first reflective electrodes arranged on the first recessed portion.

15. The display device of claim 10, wherein the second reflective electrode includes a first recessed reflective electrode arranged on the first recessed portion and a second recessed reflective electrode arranged on the second recessed portion, and the first recessed reflective electrode and the second recessed reflective electrode are symmetrical based on the convex portion.

16. The display device of claim 15, wherein the second reflective electrode includes a first convex reflective electrode arranged on the convex portion to face the first recessed reflective electrode, and a second convex reflective electrode arranged on the convex portion to face the second recessed reflective electrode, the first electrode includes a first recessed sub electrode which is in contact with the first recessed reflective electrode, a first convex sub electrode which is in contact with the first convex reflective electrode, a second recessed sub electrode which is in contact with the second recessed reflective electrode, and a second convex sub electrode which is in contact with the second convex reflective electrode, the first recessed sub electrode and the first convex sub electrode are spaced apart from each other at a second spaced distance and the second recessed sub electrode and the second convex sub electrode are spaced apart from each other at a third spaced distance, and the second spaced distance and the third spaced distance are equal to each other.

17. The display device of claim 16, wherein the second spaced distance is 0.14 µm or more.

18. The display device of claim 1, further comprising a lens array spaced apart from the substrate, and a storage case storing the substrate and the lens array.

19. The display device of claim 1, wherein the recessed portion is a contact hole for connecting the reflective electrode or the first electrode to the transistor and used as a light emitting area.

20. The display device of claim 10, wherein the transistor is connected to the first reflective electrode provided on at least one of the first recessed portion and the second recessed portion.

\* \* \* \* \*